US012476615B2

(12) United States Patent
Ballandras et al.

(10) Patent No.: US 12,476,615 B2
(45) Date of Patent: Nov. 18, 2025

(54) TWO-PORT ACOUSTIC WAVE SENSOR DEVICE

(71) Applicant: Soitec, Bernin (FR)

(72) Inventors: Sylvain Ballandras, Besançon (FR); Thierry LaRoche, Besançon (FR); Julien Garcia, Chamblay (FR); Emilie Courjon, Franois (FR)

(73) Assignee: Soitec, Bernin (FR)

( * ) Notice: Subject to any disclaimer, the term of this patent is extended or adjusted under 35 U.S.C. 154(b) by 118 days.

(21) Appl. No.: 18/549,023

(22) PCT Filed: Mar. 3, 2022

(86) PCT No.: PCT/EP2022/055415
§ 371 (c)(1),
(2) Date: Sep. 5, 2023

(87) PCT Pub. No.: WO2022/184833
PCT Pub. Date: Sep. 9, 2022

(65) Prior Publication Data
US 2024/0154603 A1 May 9, 2024

(30) Foreign Application Priority Data
Mar. 3, 2021 (FR) ...................................... 2102073

(51) Int. Cl.
*H03H 9/64* (2006.01)
*H03H 9/02* (2006.01)
(Continued)

(52) U.S. Cl.
CPC ...... *H03H 9/6413* (2013.01); *H03H 9/02574* (2013.01); *H03H 9/14502* (2013.01); *H03H 9/25* (2013.01)

(58) Field of Classification Search
CPC ............. H03H 9/6413; H03H 9/02574; H03H 9/14502; H03H 9/25; H03H 9/02102;
(Continued)

(56) References Cited

U.S. PATENT DOCUMENTS 9,124,240 B2 * 9/2015 Shimizu ............. H03H 9/14594
10,476,470 B2 * 11/2019 Takamine ............ H10N 30/704
(Continued)

FOREIGN PATENT DOCUMENTS

EP          0998037 A1    5/2000
WO    2020/200810 A1    10/2020

OTHER PUBLICATIONS

French Search Report for Application No. 2102073 dated Nov. 19, 2021, 11 pages.
(Continued)

*Primary Examiner* — Jorge L Salazar, Jr.
(74) *Attorney, Agent, or Firm* — TraskBritt

(57) ABSTRACT

An acoustic wave sensor device comprises a quartz material layer surface; arranged along a first axis, a first interdigitated transducer disposed over the planar surface of the quartz material layer, a first reflection structure disposed over the planar surface of the quartz material layer, and a second reflection structure disposed over the planar surface of the quartz material layer; and arranged along a second axis, a second interdigitated transducer disposed over the planar surface of the quartz material layer, a third reflection structure disposed over the planar surface of the quartz material layer, and a fourth reflection structure disposed over the planar surface of the quartz material layer; and wherein the first axis and the second axis are inclined to each other by a finite angle.

17 Claims, 11 Drawing Sheets

(51) Int. Cl.
*H03H 9/145* (2006.01)
*H03H 9/25* (2006.01)

(58) Field of Classification Search
CPC ............. H03H 9/02551; H03H 9/6459; H03H 9/6476; H03H 9/6486; G01N 2291/014; G01N 29/2443; G01N 29/2462; G01K 11/265
USPC .................................................. 333/193–196
See application file for complete search history.

(56) References Cited

U.S. PATENT DOCUMENTS

| | | |
|---|---|---|
| 2006/0049714 A1 | 3/2006 | Liu et al. |
| 2009/0160567 A1 | 6/2009 | Martin et al. |
| 2015/0260587 A1 | 9/2015 | Zheng et al. |

OTHER PUBLICATIONS

International Search Report for Application No. PCT/EP2022/055415 dated Jun. 30, 2023, 5 pages.
International Written Opinion for Application No. PCT/EP2022/055415 dated Jun. 30, 2023, 10 pages.

* cited by examiner

TWO-PORT ACOUSTIC WAVE SENSOR DEVICE

CROSS REFERENCE TO RELATED APPLICATIONS

This application is a national phase entry under 35 U.S.C. § 371 of International Patent Application PCT/EP2022/055415, filed Mar. 3, 2022, designating the United States of America and published as International Patent Publication WO 2022/184833 A1 on Sep. 9, 2022, which claims the benefit under Article 8 of the Patent Cooperation Treaty to French Patent Application Serial No. FR2102073, filed Mar. 3, 2021.

TECHNICAL FIELD

The present disclosure relates to sensors of the acoustic wave type and, in particular, a two-port acoustic wave sensor device comprising two transducers with corresponding reflection structures.

BACKGROUND

Sensors are of growing importance and become more and more ubiquitous in every-day life. Microelectromechanical systems (MEMS) are an attractive option to answer the demand for increased performances of sensors along with decreased sizes and costs. Surface acoustic wave (SAW) sensors, and to a lower extent bulk acoustic wave (BAW) sensors or Lamb wave or Love wave acoustic sensors, offer particularly advantageous options due to a wide variety of measurable ambient parameters including temperature, pressure, strain and torque as well as acceleration or frequency vibration of a vibrating part, for example.

Acoustic wave sensors utilize the piezoelectric effect to transduce an electrical signal into a mechanical/acoustic wave. SAW-based sensors are built on single-crystal piezoelectric materials like quartz ($SiO_2$), lithium niobate ($LiNbO_3$), lithium tantalate ($LiTaO_3$), langasite (LGS) or poly-crystal piezoelectric materials like aluminum nitride (AlN) or zinc oxide (ZnO), in particular, deposited on silicon, or even on a Piezo-On-Insulator (POI) composite material comprising a layer of piezoelectric material, in particular, a single-crystal material, such as, for example, lithium tantalate or lithium niobate, bonded to a support substrate as, for instance, silicon, if necessary by means of a bonding layer, as, for instance, a silicon oxide layer (in general, any combination of a single crystal piezoelectric material with non-piezoelectric substrates can be used in view of their specific properties like thermo-elastic properties or acoustic quality).

In the case of a surface acoustic wave sensor, an interdigitated transducer (IDT), converts the electrical energy of the electrical signal into acoustic wave energy. The acoustic wave travels across the surface (or bulk) of a device substrate via the so-called delay line to another transducer, in particular, an IDT, that converts the acoustic wave back to an electrical signal that can be detected. In some devices, mechanical absorbers and/or reflectors are provided in order to prevent interference patterns and to reduce insertion loss. In some devices, the other (output) IDT is replaced by a reflector that reflects the generated acoustic wave back to the (input) IDT that can be coupled to an antenna for remote interrogation of the sensor device. Advantageously, the measurements can be performed completely passively, i.e., the sensor has not to be powered by a power source.

A particular class of acoustic wave sensors comprises resonators exhibiting resonance frequencies that vary according to varying ambient conditions. FIG. 1 illustrates an example of a resonant acoustic wave sensor. The surface acoustic wave resonator comprises an electroacoustic interdigitated transducer IDT with interdigitated comb electrodes C and C' arranged between Bragg mirrors M. The comb electrodes are set at opposite potentials +V and −V, respectively. The electrode geometry is defined by the pitch p, i.e., the spatial repetition frequency of the interleaved electrodes C and C' in the direction of the propagation of the excited surface acoustic waves, the lengths of the gaps between the electrodes C and C' in the direction perpendicular to the direction of the propagation of the excited surface acoustic waves, the lengths of the acoustic aperture region given by the lengths of the electrodes C and C' between the gaps and the widths a of the electrodes C and C' determining the so-called metallization ratio a/p. The IDT can operate at Bragg conditions at which the wavelength λ of the excited surface acoustic wave equals twice the pitch p, for example.

At the resonance frequency, the condition of synchronism between the reflectors is satisfied thereby allowing a coherent addition of the different reflections that occur under the reflectors. A maximum of acoustic energy is observed within the resonant cavity and, from an electrical point of view, a maximum of amplitude of the current admitted by the transducer is observed. In principle, differential acoustic wave sensors may comprise two or more resonators exhibiting different resonance frequencies or a resonator working in multimode (several resonance frequencies), wherein differences in the measured frequencies reflect variations in the ambient parameters that is to be measured (the measurand) as, for example, temperature, pressure or strain.

However, despite the recent engineering progress, the entire interrogation process wherein an interrogator transmits an appropriate radiofrequency (RF) signal that is received by the acoustic wave sensor via a reception antenna and converted by a transducer into a surface acoustic wave (or bulk wave, in the case of devices of a bulk acoustic wave sensor type) that is converted into a RF signal being retransmitted via an emission antenna and received and analyzed by the interrogator still poses demanding technical problems.

True differential measurements based on appropriate differential sensitivities of the resonances of the resonator(s) used to the measurand have to be accurately observed in order to obtain reliable measurement results. This poses severe demands for tolerances of the production processes and reproducibility of physical properties from one wafer to another. In addition, any relative motion between the sensor device and the interrogator can heavily affect the measurement results due to the RF link formed by the sensor device and the interrogator in an inductive, capacitive or radiative manner. Other environmental influences, for example, temperature changes, in the measurement environment also affect the reliability of the measurement results.

Therefore, it is an object of the present disclosure to provide an acoustic wave sensor that allows for an increased signal-to-noise ratio and more reliable measurement results as compared to the acoustic wave sensor devices of the art.

BRIEF SUMMARY

The present disclosure addresses the above-mentioned object by providing an (two-port) acoustic wave sensor device (representing a dipole from a pure electrical point of view), comprising a quartz material layer (consisting of or comprising a quartz material) comprising a planar (upper) surface; arranged along a first axis, a first interdigitated transducer formed over (or on) the planar surface of the quartz material layer, a first reflection structure formed over (or on) the planar surface of the quartz material layer, and a second reflection structure formed over (or on) the planar surface of the quartz material layer; and arranged along a second axis, a second interdigitated transducer formed over (or on) the planar surface of the quartz material layer, a third reflection structure formed over (or on) the planar surface of the quartz material layer, and a fourth reflection structure formed over (or on) the planar surface of the quartz material layer; and wherein the first axis and the second axis are inclined to each other by a finite angle (i.e., the both axes are not arranged parallel to each other). The planar surface of the quartz material layer is defined by a crystal cut of a quartz material of the quartz material layer with angles φ in the range of −14° to −24°, θ in the range of −25° to −45° and ψ in the range of +8° to +28°, in particular, φ in the range of −17° to −22°, θ in the range of −30° to −40° and ψ in the range of +100 to +25°, and more particularly, φ in the range of −19° to −21°, θ in the range of −33° to −39° and ψ in the range of +150 to +25°. Particularly, the angles for the crystal cut may be φ=−20°, θ=−36° and ψ=15° to 25°, in particular, 17°.

Note that the above definition is equivalent to angles Y in the range of +140 to +24°, θ in the range of −25° to −45° and ψ in the range of −8° to −28°, according to symmetry conditions for crystal cuts rotated around the Z axis (i.e., non zero φ and ψ angles for a given crystal cut). More explicitly, one can state according symmetry rules that a (YXwlt)/+φ/+θ/+ψ cut is equivalent to a (YXwlt)/−φ/+θ/−ψ cut.

The angles defining the crystal cut and, thus, the planar surface, are defined in accordance with the IEEE 176 1949 Standards on Piezoelectric Crystals, 1949 from Dec. 12, 1949 (see also detailed description below). The quartz crystal may have a cutting plane (X", Z") defined with respect to the cutting plane (X, Z) and in a reference system (X", Y", Z"), where X, Y, Z are crystallographic axes of quartz, a direction of propagation of the waves being defined along an axis X'", a first cutting plane (X', Z') being defined by rotation by an angle Y about the axis Z of the plane (X, Z) so as to define a first reference system (X', Y', Z') with an axis Z' that is the same as the axis Z, a second cutting plane (X", Z") being defined by rotation by an angle θ about the axis X' of the plane (X', Z') so as to define a second reference system (X", Y", Z") with the axis X" being the same as the axis X', the direction of propagation along the axis X' being defined by rotation by an angle ψ of the axis X", in the plane (X", Z") about the axis Y", wherein according to the present disclosure: y is in the range of −14° to −24°, θ in the range of −25° to −45° and ψ in the range of +8° to +28°.

The quartz material layer can be a quartz bulk substrate or a quartz layer formed on a non-piezoelectric bulk substrate. In the latter case, the non-piezoelectric bulk substrate may be a silicon substrate, and optionally comprises at its surface a so-called trap-rich layer (e.g., provided by a layer of polycrystalline silicon). The trap-rich layer allows reducing the insertion loss and reducing RF loss due to electric charge trapping induced at the interface with the silicon substrate. It can be also a sapphire substrate, which is of high interest to maximize the quality factor of the resonance by minimizing the visco-elastic losses in the substrate. Sapphire is known to be one of the most advantageous materials according that aspect (with Yttrium based garnets and more particularly Yttrium Aluminum Garnet—YAG).

The first interdigitated transducer is arranged along a first axis at an angle ψ1 and formed over (or on) the planar surface of the quartz material layer, the angle ψI defining the direction of propagation of the acoustic wave along the axis X'" being defined by rotation by an angle ψI of the axis X" of the quartz substrate. The second interdigitated transducer is arranged along a second axis at an angle ψ2 and formed over (or on) the planar surface of the quartz material layer, the angle ψ2 defining the direction of propagation of the acoustic wave along the axis X'" being defined by rotation by an angle ψ2 of the axis X" of the quartz substrate. The angle ψ1 and ψ2 are comprised in the range of +8° to +28°. The finite angle defined between the first and second axes may be in the range of 1° to 10°, in particular, 1° to 6°, more particularly, 2° to 4°. The finite angle between the first and second axes results in different propagation directions of the generated (surface) acoustic waves that in course result in different resonance frequencies, as the propagation of the acoustic wave is perpendicular to the electrodes of the first and second interdigitated transducer.

Herein, the first transducer, first reflection structure and second reflection structure are considered as a first resonator and the second transducer, third reflection structure and fourth reflection structure are considered as a second resonator. Experiments have proven that the combination of the described quartz material layer as a piezoelectric layer and the tilted configuration of the two-port (resonators) acoustic wave sensor device allows for obtaining particular accurate measurement results (see also detailed description below). Particularly, the first and second resonators may be formed very similar to each other with respect to the design and physical properties. They may show very similar thermal sensitivities but with first order temperature coefficients of frequency (TCF) different enough to provide a linear differential temperature sensitivity. Thus, according to an embodiment, the first and second interdigitated transducers have the same number of electrodes and/or the same metallization ratio and/or the same aperture and/or the same tapering and/or lengths of electrodes. It may be advantageous to have different periods (separation distances between individual electrodes) for the first and second transducers in order to achieve significant differences (enhance the differences caused by the finite angle between the first and second axes) in the resonance frequencies of the first and second resonators. In principle, the differential sensitivity of the measurements may be increased by using two resonators connected in series or parallel to each other as compared to the employment of a single one-port acoustic wave sensor device.

At least one of the first, second, third and fourth reflection structures of the inventive acoustic wave sensor device comprises or consists of a Bragg mirror. Such reflection structures may be easily formed and may provide high reflectivity. For example, all the first, second, third and fourth reflection structures of the inventive acoustic wave sensor device comprise or consist of respective Bragg mirrors. In this case, all Bragg mirrors may have the same number and/or lengths of electrodes. Further, in this case, the electrodes of each of the Bragg mirrors may, respectively, be connected to each other or grounded (connected to ground) or they are neither connected to each other nor grounded. The selection of the configuration may be motivated by the possibility to slightly modulate the actual value of the reflection coefficient for optimizing the resonator quality coefficient, insolation or even thermal parameters. The structures may include one or more gaps for maximizing the quality coefficients of the resonators or to optimize the operation of the device on a given operating point, for instance, to force the resonator to operate at the middle of the stop band of the Bragg mirror, to correct directivity effects (resonance is split between the beginning and end of the stop band, which is not a favorable operating point) or to promote the operation at anti-resonance instead of resonance with IDT dimensions smaller than the one required for resonators without gaps.

According to another embodiment, at least one of the first, second, third and fourth reflection structures comprises a groove or an edge reflection structure or a short reflector comprising not more than three electrodes. One skilled in the art would know how to adjust the depth of the groove or the thickness of the electrodes of the Bragg mirrors to provide a reflection coefficient in excess of, for example, 20%, which is achievable for a given crystal orientation, wave polarization and electrode nature.

According to an embodiment the first and second reflection structures are arranged adjacent to the first interdigitated transducer and the third and fourth reflection structures are arranged adjacent to the second interdigitated transducer (i.e., the reflection structures define the resonance regions). Alternatively, a) a first resonance cavity is formed between the first interdigitated transducer and the first reflection structure and a second resonance cavity is formed between the first interdigitated transducer and the second reflection structure and b) a third resonance cavity is formed between the second interdigitated transducer and the third reflection structure and a fourth resonance cavity is formed between the second interdigitated transducer and the fourth reflection structure. The resonance cavities comprise parts of the upper planar surface of the quartz material layer.

An upper surface of the second resonance cavity may comprise a physical and/or chemical modification as compared to an upper surface of the first resonance cavity. An upper surface of the fourth resonance cavity may comprise a physical and/or chemical modification as compared to an upper surface of the third resonance cavity. For example, the physical and/or chemical modification comprises a metallization layer or passivation layer formed on the upper surface of the second resonance cavity.

The metallization layer may comprise or consist of at least one of AlCu and Ti and the passivation layer may comprise or consist, but is not limited to, of at least one of $Si_3N_4$, $Al_2O_3$, AlN, $Ta_2O_5$ and $SiO_2$. The metallization layer may be made of the same material as electrodes of the first transducer (and, thus, may be formed in the same processing step as the one used for forming the electrodes). If Bragg mirrors are used as reflection structures, they may be made of the same metal material as used for the formation of the metallization layer and/or the electrodes of the first transducer.

Another option for physically modifying an upper surface of the second and fourth resonance cavities comprises recessing the surface of the second resonance cavity with respect to the upper surface of the first resonance cavity and recessing the surface of the fourth resonance cavity with respect to the upper surface of the third resonance cavity.

An upper surface of the first (third) resonance cavity may also be subject to a physical and/or treatment as described above but in a different manner as compared to the surface of the second (fourth) resonance cavity.

The modification of one of the first (third) and second (fourth) upper surfaces of the resonance cavities by a metallization layer or passivation layer may result in that the propagation characteristics of acoustic waves generated by the interdigitated transducer differ in the second (fourth) resonance cavity from the ones in the first (third) resonance cavity. Thereby, a very reliable and sensitive differential sensor device may be provided. Without modification the first and second upper surfaces are free (exposed) surfaces, particularly, free surfaces of a quartz material layer piezoelectric layer.

In all of the above-described examples the extension lengths of the first resonance cavity and the second resonance cavity may differ from each other and the extensions lengths of the third resonance cavity and the fourth resonance cavity may differ from each other in order to more clearly separate the spectral responses of the resonances of the first resonance cavity and the second resonance cavity and, thereby, the first and second resonators, from each other.

According to particular embodiments, in all of the above-described examples the first and second interdigitated transducers may, respectively, be split into two parts and additional reflection structures may be positioned between the respective two parts of the transducers. Such a configuration may be advantageous in operation situations in that the reflection coefficients of the first and second transducers are not strong enough to allow for a clear enough separation between the resonances of the first and second resonators. The first part of the first (second) interdigitated transducer comprises a first number of electrodes and the second part of the first (second) interdigitated transducer comprises a second number of electrodes and the first number of electrodes may be different from the second number. Additionally or alternatively, the lengths of at least some of the electrodes of the first number of electrodes may be different from the lengths of at least some of the electrodes of the second number of electrodes (i.e., the lengths of the two transducers in a direction perpendicular to the traveling direction of the surface acoustic waves). Further, the apertures of the first and second parts of the first (second) transducer may differ from each other. By such approaches, a fine tuning is made available in order to compensate for intrinsic losses caused by the metallization or passivation layer due to diffusion, wave velocity changes, change of optimal resonance conditions, etc.

Moreover, cascaded resonance cavities may be formed in the acoustic wave sensor device according to one of the above-described embodiments in order to reduce the number of resonances to arrive at unique measurement results. Thus, the acoustic wave sensor device according to one of the above-described examples may be configured such that the first and third resonance cavities comprise first sub-cavities separated from each other by reflection sub-structures of the first and third reflection structures, respectively, and the second and fourth resonance cavities comprise resonance sub-cavities separated from each other by reflection sub-structures of the second and fourth reflection structures, respectively. Each of the reflection sub-structures may consist of elongated electrodes arranged in parallel to each other.

In general, the acoustic wave sensor device according to one of the above-described examples may be a passive surface acoustic wave sensor device configured for sensing an ambient parameter, for example, one of a temperature, chemical species, strain, pressure or torque of a rotating axis.

Furthermore, it is provided a system for monitoring/measuring an ambient parameter, for example, a temperature, a strain level, a pressure or a torque level of a rotating axis, a chemical species, etc., that comprises an interrogation device and an acoustic wave sensor device and/or acoustic wave sensor assembly according to one of the above-described embodiments that is communicatively coupled to the interrogation device.

The interrogation device for interrogating an acoustic wave sensor may comprise a transmission antenna configured for transmitting an RF interrogation signal to the acoustic wave sensor device, a reception antenna configured for receiving an RF response signal from the acoustic wave sensor device that may also comprise a transmission/reception antenna and a processing means for processing/analyzing the RF response signal in order to determine an ambient parameter that is to be sensed.

BRIEF DESCRIPTION OF THE DRAWINGS

Additional features and advantages of the present disclosure will be described with reference to the drawings. In the description, reference is made to the accompanying figures that are meant to illustrate preferred embodiments of the present disclosure. It is understood that such embodiments do not represent the full scope of the present disclosure.

DETAILED DESCRIPTION

Figure 1:
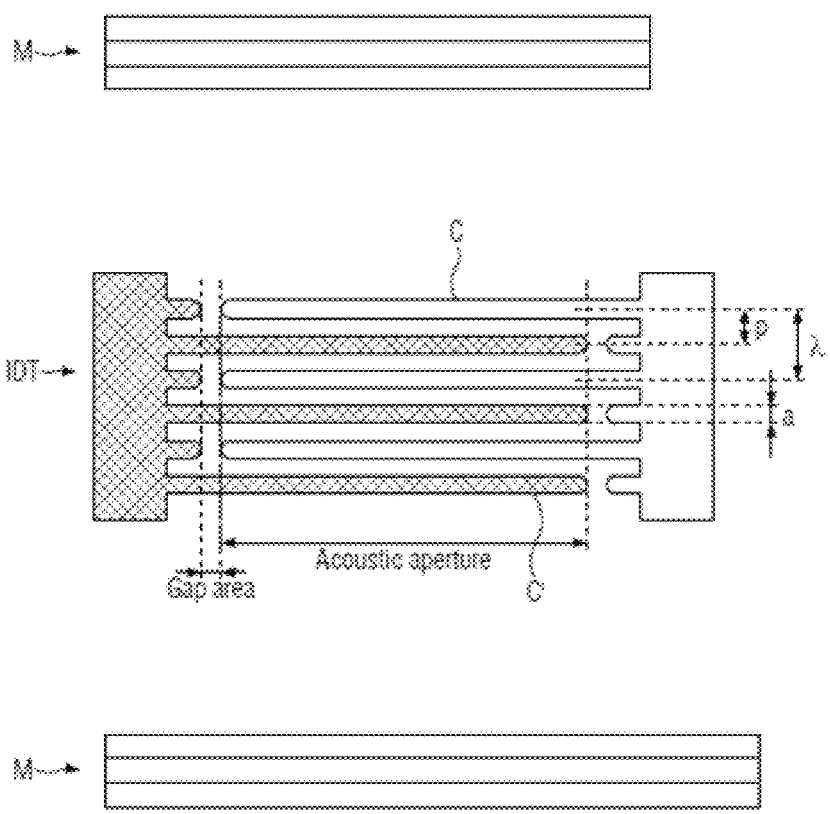
FIG. 1 represents an example of a surface acoustic wave sensor device according to the art.

The present disclosure provides acoustic wave sensors, in particular, passive SAW sensors, that are characterized by a high signal-to-noise ratio, sensitivity and reliability, in particular, robustness against environmental influences and residual stresses not resulting from variations of the measurand, and high accuracy of differential measurements. These advantages are, particularly, achieved by using a piezoelectric quartz material layer providing resonance cavities that is characterized by a plane surface resulting from a crystal cut defined at angles $\varphi$ in the range of $-14°$ to $-24°$, $\theta$ in the range of $-25°$ to $-45°$ and $\psi$ in the range of $+8°$ to $+28°$, in particular, $\varphi$ in the range of $-17°$ to $-22°$, $\theta$ in the range of $-30°$ to $-40°$ and $\psi$ in the range of $+10°$ to $+25°$, and more particularly, $\varphi$ in the range of $-19°$ to $-21°$, $\theta$ in the range of $-33°$ to $-39°$ and $\psi$ in the range of $+150$ to $+250$ according to the IEEE 176 1949 Standards on Piezoelectric Crystals, 1949 from Dec. 12, 1949.

With respect to temperature measurements, for example, the obtainable resonance frequency sensitivity allows for a differential measurement sensitivity of more than 1 ppm per Kelvin together with second order TCF sensitivity (absolute value) smaller than 10 ppb·K$^{-2}$ and even less than 5 ppb·K$^{-2}$, thus guarantying a quasi-linear frequency-temperature variation over extended temperature ranges (typically 100 K ranges). The acoustic wave sensors can be interrogated by any interrogators that are configured to determine a response spectrum from an interrogated acoustic wave sensor. The interrogated acoustic wave sensor can, for example, be a resonator device, for example, a differential SAW sensor. It goes without saying that the present disclosure can be implemented in any devices employing acoustic wave sensors or dielectric resonators, RLC circuits, etc.

The interrogation device (also called unit) interrogating one of the inventive acoustic wave sensor devices may comprise a transmission antenna for transmitting a RF interrogation signal to the sensor device and a reception antenna for receiving a RF response signal from the sensor device. The RF interrogation signal transmitted by the transmission antenna may be generated by a signal generator that may comprise a RF synthesizer or controlled oscillator as well as optionally some signal shaping module providing a suitable frequency transposition and/or amplification of the signal to be transmitted by the transmission antenna. The RF interrogation signal generated by the signal generator may be a pulsed or burst signal with a frequency selected according to the resonance frequency of the acoustic wave sensor device. It is noted that the emission antenna and the reception antenna may be the same antenna. In this case, the emission and reception processes should be synchronized with each other, for example, by means of a suitably controlled switch.

Furthermore, the interrogation device may comprise a processing means connected to the reception antenna. The processing means may comprise filtering and/or amplification means and be configured for analyzing the RF response signal received by the reception antenna. For example, the sensor device operates at a resonance frequency of 434 MHz or 866 MHz or 915 MHz or 2.45 GHz (the ISM bands).

The interrogation device may transmit a long RF pulse and after the transmission has been stopped, the resonance cavities of the sensor device discharge at their resonant eigenfrequencies with time constants T equal to $Q_f/\pi F$ wherein F is the central frequency and $Q_f$ is the quality factor of the resonance, $Q_f$ corresponding to the ratio between the resonance central frequency and the width at half maximum of the band pass used in the interrogation process. For instance, $Q_f$ corresponds to the resonance quality factor estimated on the real part of the resonator admittance (the conductance) when the latter is designed to operate at the resonance. Spectral analysis performed by the processing means of the interrogation device allows for calculating the resonator frequency/frequencies and, thereby, the sensing of an ambient parameter. The received RF response signal may be mixed by the processing means with RF interrogation signal according to the so-called I-Q protocol as known in the art to extract the real and imaginary parts (in-phase components I=Y cos φ and quadrature components Q=Y sin φ with the signal amplitude Y and the signal phase φ) from which the modulus and phase can then be derived.

FIGS. 2 to 5 illustrate exemplary embodiments of an inventive surface acoustic wave (SAW) sensor device. The sensor devices 20, 30, 40 and 50 shown in FIGS. 2 to 5 are formed using a quartz material layer Q as a piezoelectric layer. Either the quartz material layer Q is a quartz bulk substrate or a quartz layer formed over some non-piezoelectric bulk substrate, for example, a Si substrate. The quartz material layer Q may be part of a piezo-electric-on-insulator (POI) substrate. The quartz layer may be bonded to the non-piezoelectric bulk substrate by means of a (dielectric) bonding layer, as, for instance, a silicon oxide layer. A so-called trap-rich layer (e.g., polycrystalline silicon) can be present at the interface with the non-piezoelectric bulk substrate.

The quartz material layer Q comprises an upper operating planar surface and the planar surface of the quartz material layer Q is defined by a crystal cut of a quartz material of the quartz material layer with angles φ in the range of −14° to −24°, θ in the range of −25° to −45° and ψ in the range of +8° to +28°, the angles being defined in accordance with the IEEE 176 1949 Standards on Piezoelectric Crystals, 1949 from Dec. 12, 1949. It is this particular cut family that at least partially provides the advantages mentioned and described above.

A SAW sensor device according to an embodiment of the present disclosure, for example, the SAW sensor device 20, 30, 40 and 50 shown in FIGS. 2 to 5, comprises a first resonator R1 comprising a first interdigitated (comb) transducer T1 and a first Bragg mirror M1 and a second Bragg mirror M2 and a second resonator R2 comprising a second interdigitated (comb) transducer T2 and a third Bragg mirror M3 and a fourth Bragg mirror M4. The transducers T1 and T2 may be connected to an antenna (not shown in FIG. 2) for receiving an electromagnetic wave and converting the electromagnetic wave into a surface acoustic wave that, after reflection by the mirrors, is sensed again and converted back into an RF signal that in course in transmitted by the antenna (or another antenna) as an RF response signal to a reader.

The first and second resonators R1 and R2 may be made similar to each other. Particularly, the first and second transducers T1 and T2 may have the same number of electrodes and/or the same metallization ratio and/or the same aperture and/or the same tapering and/or lengths of electrodes. The first and second transducers T1 and T2 may have different periods (separation distances between individual electrodes) in order to achieve significant differences in the resonance frequencies of the first and second resonators R1 and R2.

According to the present disclosure, the first and second resonators R1 and R2 are tilted with respect to each other, i.e., the first interdigitated transducer T1 formed over the planar surface of the quartz material layer Q, the first Bragg mirror M1 formed over the planar surface of the quartz material layer Q, and the second Bragg mirror M2 formed over the planar surface of the quartz material layer Q are arranged along a first axis and the second interdigitated transducer T2 formed over the planar surface of the quartz material layer Q, the third Bragg mirror M3 formed over the planar surface of the quartz material layer Q and the fourth Bragg mirror M4 formed over the planar surface of the quartz material layer Q are arranged along a second axis and the first axis and the second axis are inclined to each other by a finite angle. The first axis corresponds to an axis at an angle ψ1, the angle φ1 defining the direction of propagation of the acoustic wave along the axis X''' being defined by rotation by an angle φ1 of the axis X'' of the quartz substrate. The second axis corresponds to an axis at an angle ψ2, the angle φ2 defining the direction of propagation of the acoustic wave along the axis X''' being defined by rotation by an angle φ2 of the axis X'' of the quartz substrate. The angle ψ1 and ψ2 are comprised in the range of +8° to +28° of the angle ψ defined for the quartz substrate. The finite angle between the first and second axes may be in the range of 1° to 10°, in particular, 1° to 6°, more particularly, 2° to 4°, and results in different propagation directions of the generated (surface) acoustic waves that in course result in different resonance frequencies of the first and second resonators R1 and R2.

The surface acoustic wave sensor devices 20, 30, 40 and 50 shown in FIGS. 2 to 5 may operate at Bragg conditions with wavelengths of the excited surface acoustic waves of some multiples of the pitches of the comb electrodes of the comb transducers T1 and T2. When operation is performed at Bragg conditions the comb transducers themselves substantially functions as mirrors. However, in operation situations in that the reflection coefficient of the transducers T1 and T2 is not strong enough to allow for a clear enough separation between the individual resonances it is advantageous to split each of the transducers T1 and T2 into two parts and arrange an additional mirror between, respectively. Improvement of the cavity resonance separation by means of the split transducer and the additional mirror is particularly useful for operating with Rayleigh or more generally elliptically polarized waves.

It is noted that the electrodes of the first and second transducers T1 and T2 may be made of or comprise AlCu. The use of materials with relatively high atomic numbers like, for instance, molybdenum or gold or platinum or tungsten may allow for larger reflection coefficients. It is, furthermore, noted that the configurations of the acoustic wave sensor devices 20, 30, 40 and 50 shown in FIGS. 2 to 5 may comprise tapered transducers T1 and T2 with lateral extensions of the electrodes varying along the lengths of the transducers T1 and T2 to suppress transverse wave modes. Further, supplementary mass loads may be provided at the edges of the electrodes in order to suppress transverse wave modes.

According to different embodiments the resonators R1 and R2 (transducers T1 and T2) can be connected in series or parallel to each other. In the embodiment shown in FIG. 2, the resonators R1 and R2 of the acoustic wave sensor device 20 are connected parallel to each other and the electrodes of each of the mirrors M1, M2, M3 and M4 are connected with each other (short-circuited). In the embodiment shown in FIG. 3, the resonators R1 and R2 of the acoustic wave sensor device 30 are connected parallel to each other and the mirrors M1, M2, M3 and M4 are connected to ground. In the embodiment shown in FIG. 4, the resonators R1 and R2 of the acoustic wave sensor device 40 are connected parallel to each other and the electrodes of each of the mirrors M1, M2, M3 and M4 are not connected with each other. In the embodiment shown in FIG. 5, the resonators R1 and R2 of the acoustic wave sensor device 50 are connected in series to each other and the electrodes of each of the mirrors M1, M2, M3 and M4 are connected with each other. In FIGS. 2 to 5, an electromagnetic wave received by the transducers T1 and T2 (i.e., an interrogation signal) for the generation of acoustic waves is indicated by E1 and a back-converted acoustic wave signal (i.e., a response signal) is indicated by S1.

The configurations shown in FIGS. 2 to 5 allow, for example, for accurately sensing temperatures based on variations of the resonance frequencies of the resonators R1 and R2 and, thus, the differences in resonance frequencies, depending on the actual temperature.

In the embodiments shown in FIGS. 2 to 5 the mirrors M1, M2, M3 and M4 are arranged adjacent to the transducers T1 and T2. According to other embodiments resonance cavities are formed between the first transducer T1 and the first and second mirrors M1 and M2, respectively, and/or resonance cavities are formed between the second transducer T2 and the third and fourth mirrors M3 and M4, respectively.

Figure 2:
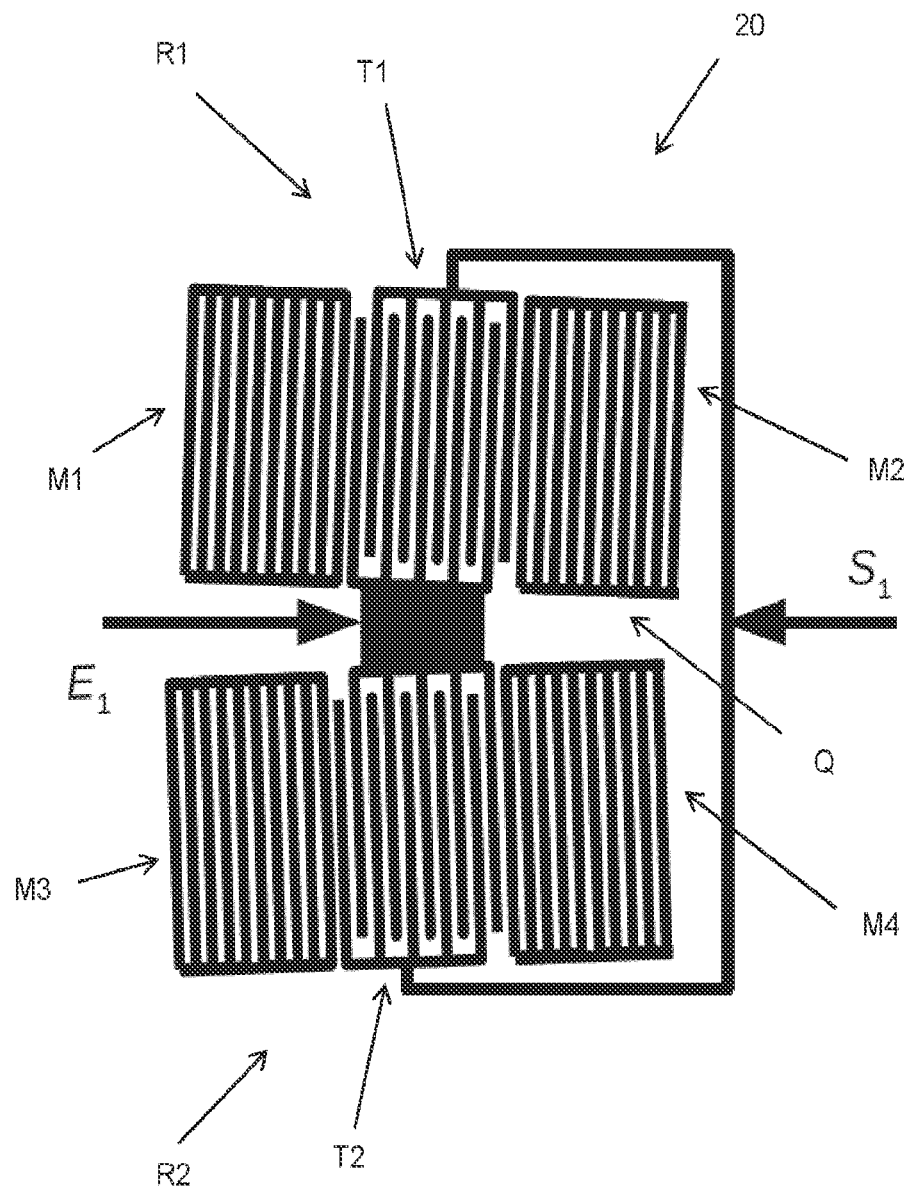
FIG. 2 represents a principle sketch illustrating a two-port acoustic wave sensor device according to an embodiment of the present disclosure.
Figure 6:
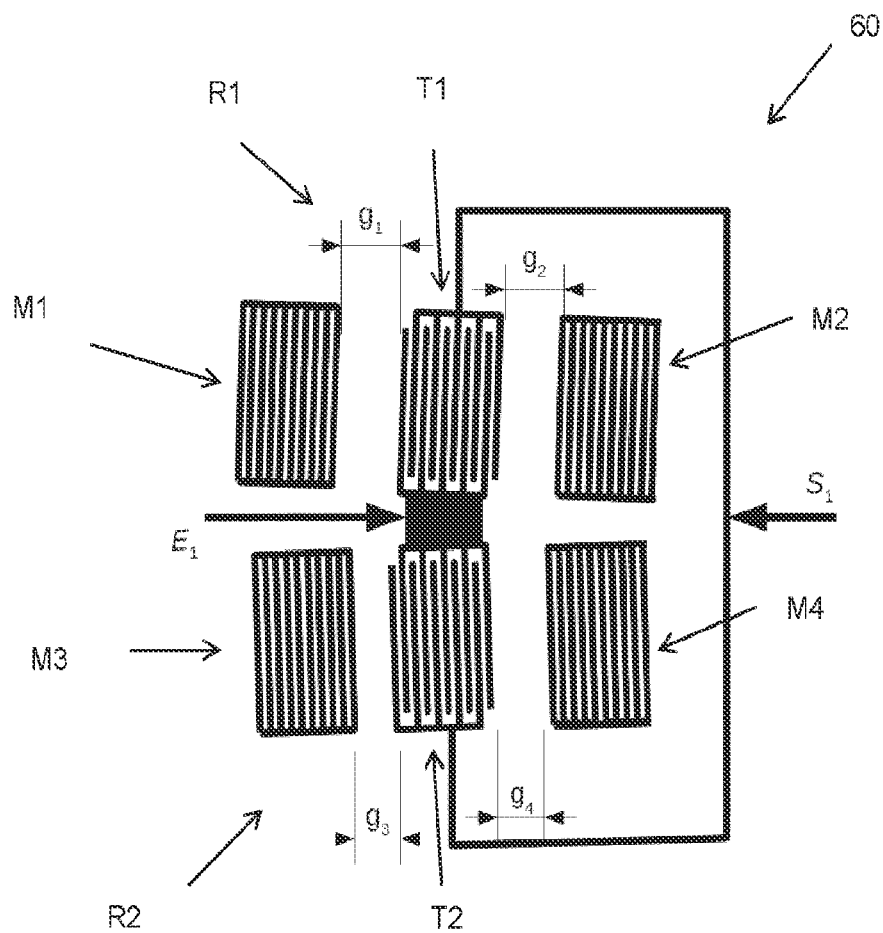
FIG. 6 represents a principle sketch illustrating a two-port acoustic wave sensor device comprising resonance cavities formed between transducers and mirrors according to an embodiment of the present disclosure.

FIG. 6 shows an exemplary embodiment similar to the one shown in FIG. 2. Different from the configuration shown in FIG. 2, in the embodiment shown in FIG. 6 an acoustic wave sensor device 60 comprises a first resonance cavity with length g1 formed between the first transducer T1 and the first mirror M1 and a second resonance cavity with length g2 formed between the first transducer T1 and the second mirror M2. Similarly, a third resonance cavity with length g3 is formed between the second transducer T2 and the third mirror M3 and a fourth resonance cavity with length g4 is formed between the second transducer T2 and the fourth mirror M4. Alternatively, the first resonator R1 or the second resonator R2 only has the resonance cavities with lengths g1 and g2 or g3 and g4, respectively.

In principle, the upper surface of the resonance cavity between the first transducer T1 and the first mirror M1 may comprise a physical and/or chemical modification as compared to the upper surface of the resonance cavity between the first transducer T1 and the second mirror or the other way round. Similarly, the upper surface of the resonance cavity between the second transducer T2 and the third mirror M3 may comprise a physical and/or chemical modification as compared to the upper surface of the resonance cavity between the second transducer T2 and the fourth mirror M4 or the other way round. All or some of the cavities with lengths g1, g2, g3 and g4 may differ from each other with respect to physical and/or chemical modifications and/or the extension lengths g1, g2, g3 and g4.

There is a variety of means for providing the physical and/or chemical modifications in order to achieve propagating wave modes that exhibit differential parametric sensitivities. These means, for example, include realization of the physical and/or chemical modifications by the formation of a metallization layer and/or passivation layer and/or local doping. A metallization layer of some 100 nm thickness may be formed on the region of the resonance cavity of length g1, for example; no metallization layer may be formed on the resonance cavity of length g2. The metallization layer may be formed of the same material as the electrodes of the transducers T1 and T2 and/or the Bragg mirrors M1, M2, M3 and M4.

When the same material is used for the metallization and the formation of the comb transducers T1 and T3 and electrodes of the Bragg mirror structures M1, M2, M3 and M4, all of these elements can be deposited in the same deposition process. In other embodiments, a different material is used for the metallization. For example, one metallization layer or passivation layer of one material is formed on a first resonance cavity and another metallization layer or passivation layer of another material is formed on a second resonance cavity of one or each of the resonators R1 and R2. According to another example, a positive-temperature shifting material, for example, $SiO_2$ or $Ta_2O_5$, is formed on one of the resonance cavities and a negative-temperature shifting material, for example, $Si_3N_4$ or AlN, or no additional material is formed on the other one of the resonance cavities of one or each of the resonators R1 and R2.

Passivation may be realized by forming a passivation layer made of or comprising $Si_3N_4$, $Al_2O_3$ or AlN. According to other embodiments, material layers can be formed on both resonance cavities. Moreover, material layers formed on one or more of the resonance cavities may have inhomogeneous thicknesses along the direction of propagation of the acoustic waves. Further, multi-layers may be formed on one or more of the resonance cavities. In this context, it should be noted that, in general, provision of a material layer on a resonance cavity may result in a reduction of the phase velocity of acoustic waves due to mass loading effects, particularly, if layers of a material of a high atomic number, as Pt, Au or W, are used. This effect can be compensated by adding a layer exhibiting a relatively high acoustic velocity, for example, AlN, $Si_3N_4$, $Al_2O_3$, adjacent to the quartz material layer. The resonance cavities exhibit different sensitivities to measurands due to the provided different resonance characteristics caused by different treatments of the surfaces and, thus, allow for differential measurements.

Alternatively or additionally, the physical and/or chemical modification may comprise a recess of the surface of one of the resonance cavities with respect to the surface of the other of the resonance cavities of one or each of the resonators R1 and R2.

Figure 3:
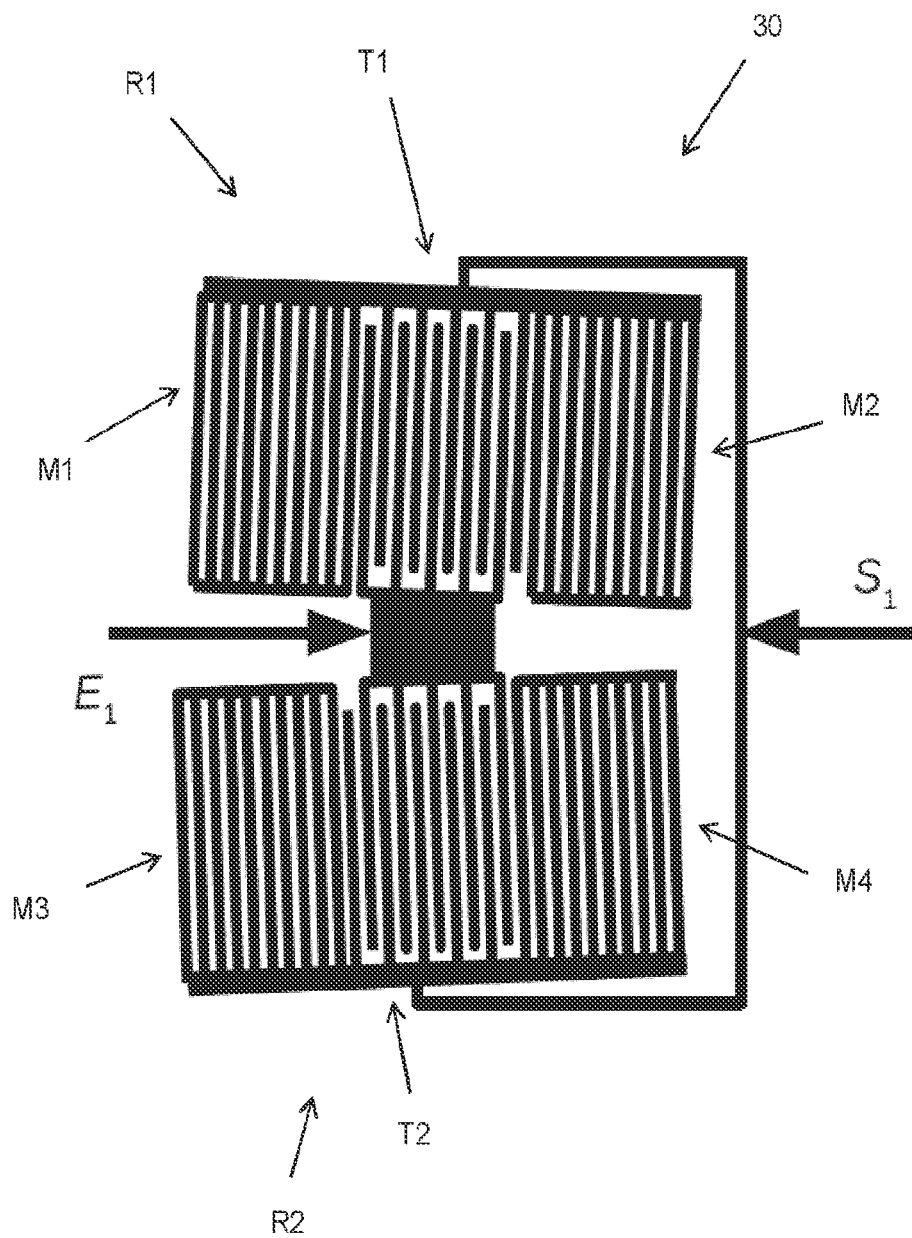
FIG. 3 represents a principle sketch illustrating a two-port acoustic wave sensor device according to an embodiment of the present disclosure.
Figure 4:
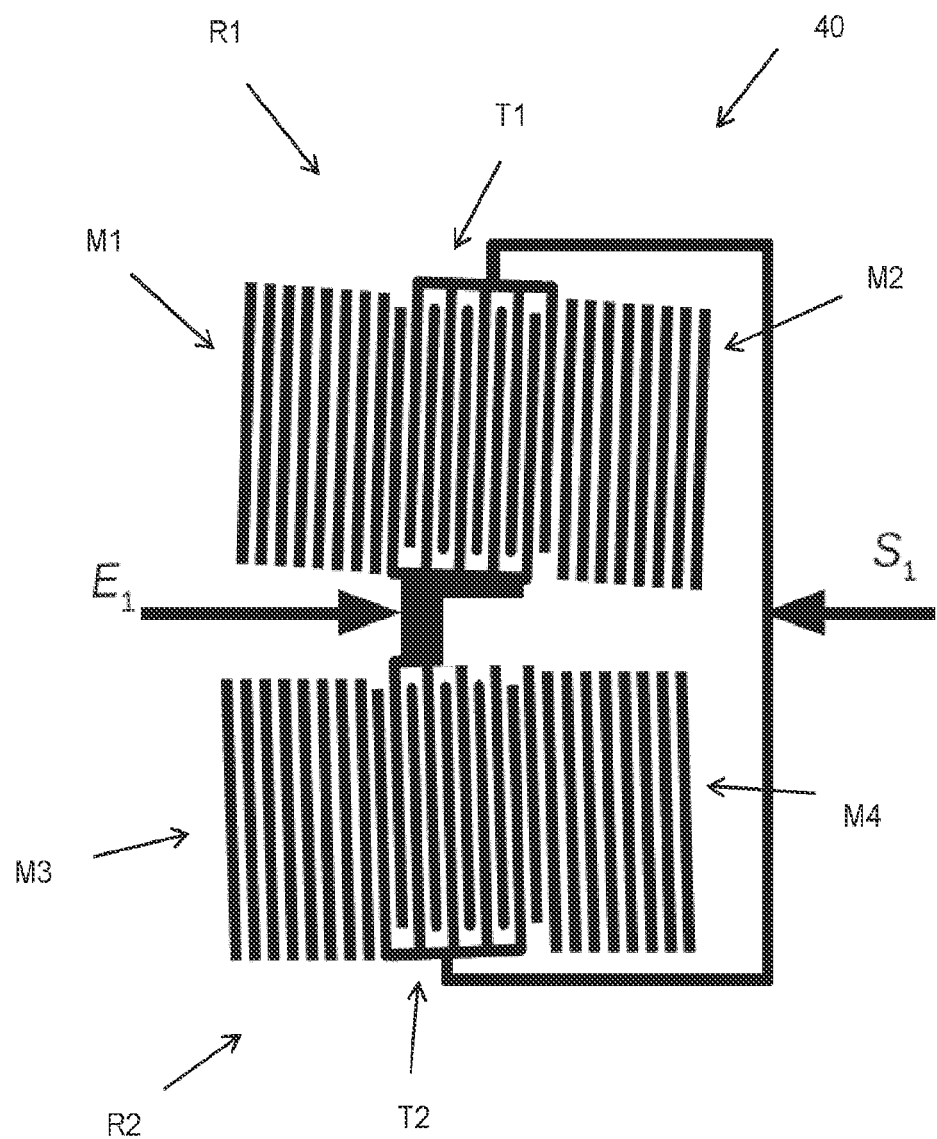
FIG. 4 represents a principle sketch illustrating a two-port acoustic wave sensor device according to an embodiment of the present disclosure.
Figure 5:
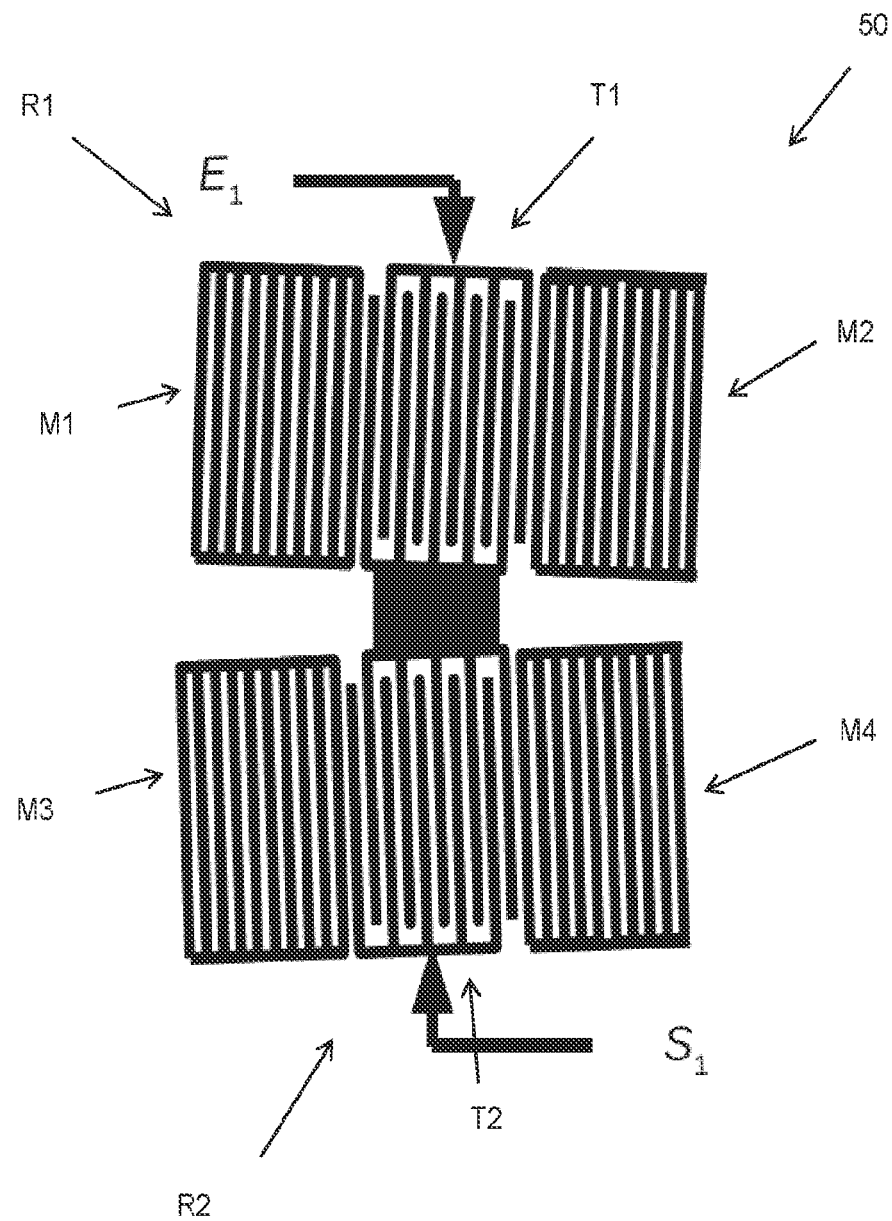
FIG. 5 represents a principle sketch illustrating a two-port acoustic wave sensor device according to an embodiment of the present disclosure.
Figure 7:
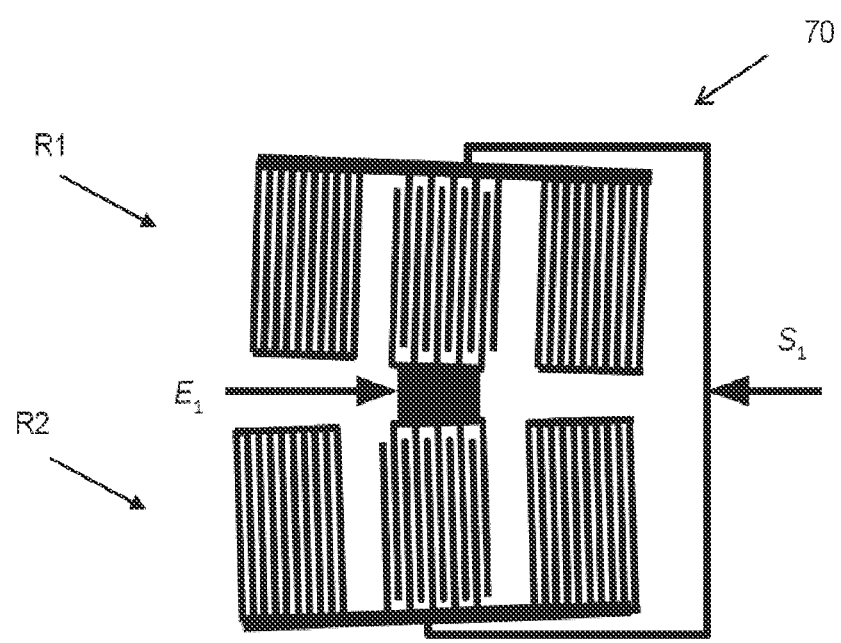
FIG. 7 represents a principle sketch illustrating a two-port acoustic wave sensor device comprising resonance cavities formed between transducers and mirrors according to an embodiment of the present disclosure.
Figure 8:
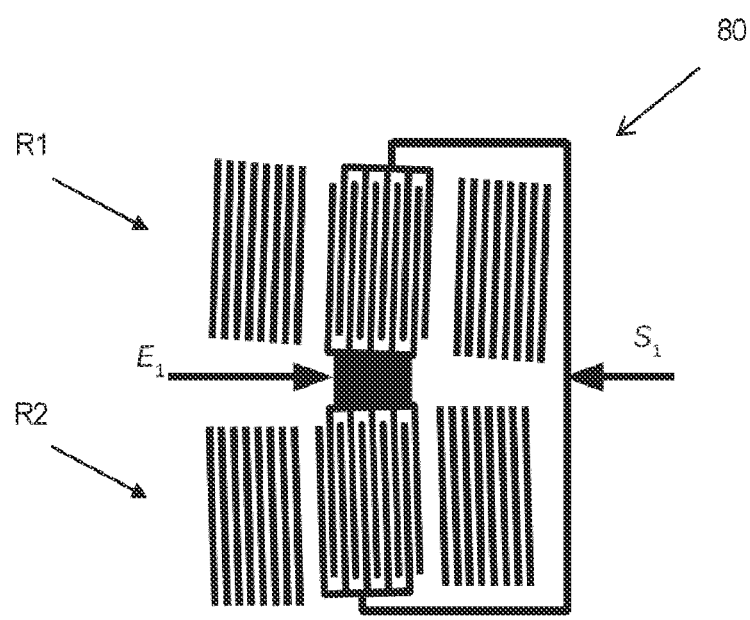
FIG. 8 represents a principle sketch illustrating a two-port acoustic wave sensor device comprising resonance cavities formed between transducers and mirrors according to an embodiment of the present disclosure.
Figure 9:
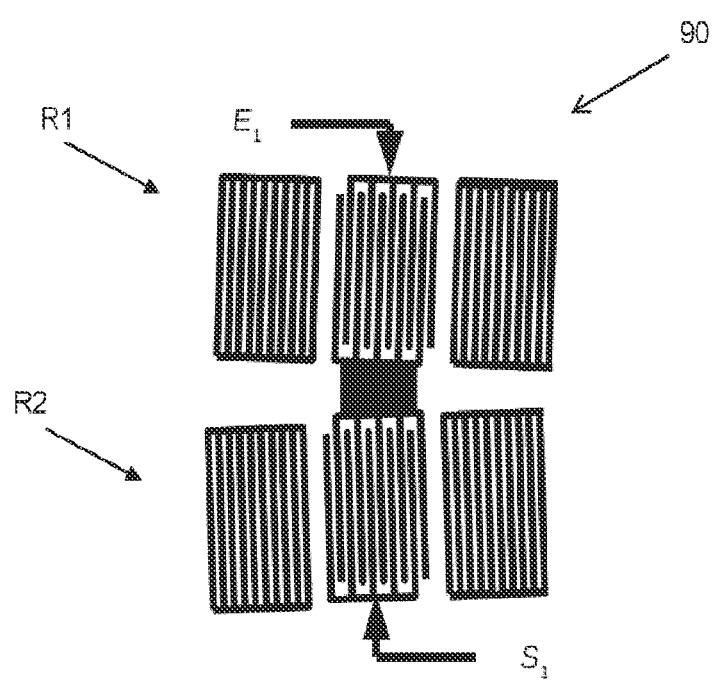
FIG. 9 represents a principle sketch illustrating a two-port acoustic wave sensor device comprising resonance cavities formed between transducers and mirrors according to an embodiment of the present disclosure.

The configurations shown in FIGS. 3 to 5 may, according to alternative embodiments, also show resonance cavities in the first and/or second resonators as described above. For example, FIG. 7 shows an acoustic wave sensor device 70 similar to the acoustic wave sensor device 30 shown in FIG. 3 but with the first and second resonators R1 and R2 comprising resonance cavities, FIG. 8 shows an acoustic wave sensor device 80 similar to the acoustic wave sensor device 40 shown in FIG. 4 but with the first and second resonators R1 and R2 comprising resonance cavities, and FIG. 9 shows an acoustic wave sensor device 90 similar to the acoustic wave sensor device 50 shown in FIG. 5 but with the first and second resonators R1 and R2 comprising resonance cavities.

In the above-described embodiment shown in FIGS. 2 to 5, Bragg mirrors M1, M2, M3 and M4 are provided as reflection structures. However, according to alternative embodiments one or more of the Bragg mirrors may be replaced by side/edge reflection structures for pure shear mode guidance. Thereby, very compact configurations can be achieved in that the Bragg reflection is replaced by a flat surface reflection without any energy loss or mode conversion. Configurations with side/edge reflection structures for pure shear mode guidance are particularly useful for sensing ambient parameters in liquids. Shear waves are very suitable for in-liquid probing. Particularly, highly coupled modes (>5%) together with high-k materials (with a dielectric constant k larger than 30, for example) are attractive for in-liquid applications. According to other embodiments, one or more reflection structures are realized in the form of short reflectors comprising not more than three electrodes.

It is, furthermore, noted that simple resonance cavities may be replaced by cascaded resonance cavities comprising multiple mirror electrode structures. The spectral distance between the two resonances as well as the coupling coefficient of the resonances can be controlled by the number of the mirror electrode structures and resonance sub-cavities.

All previously discussed embodiments are not intended as limitations but serve as examples illustrating features and advantages of the present disclosure. It is to be understood that some or all of the above described features can also be combined in different ways.

Figure 10:
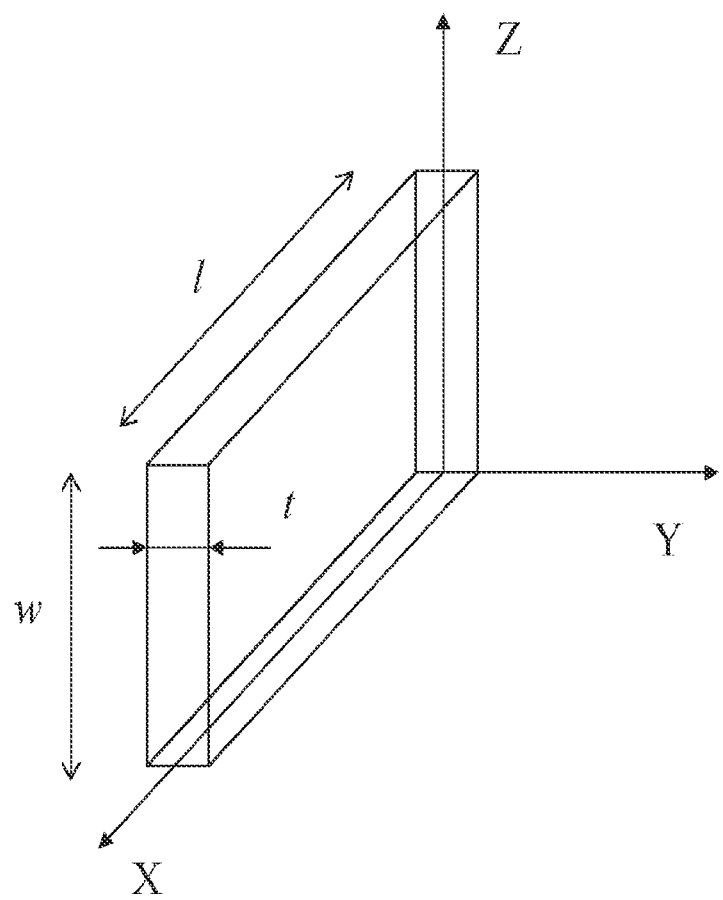
FIG. 10 represents a sketch illustrating coordinates and angles of a piezoelectric plate.

In the present disclosure, crystal cuts are defined in accordance with the IEEE 176 1949 Standards on Piezoelectric Crystals, 1949 from Dec. 12, 1949. In that standard, a crystal cut for SAW applications is uniquely defined by three angles, namely φ and θ defining the rotation of the crystal according a reference configuration of the crystal and ψ a propagation direction defined in the plane (φ, θ) that indicates the direction toward which the waves are propagating and hence the position of the transducer capable to launch the waves. Y and X denote crystalline axes considered as references for the definition of the initial state of the crystal plate. The first one is the axis normal to the plate whereas the second axis lies along the length of the plate. The plate is assumed to be rectangular, characterized by its length l, its width w and its thickness t (see FIG. 10). The length/is lying along the crystalline axis X, the width w is along the Z axis and the thickness t along the Y axis considering the given (YX) axis system. Note that the case of (YXwlt)/0°/0°/0° actually coincides to the configuration shown in FIG. 10.

Figure 11:
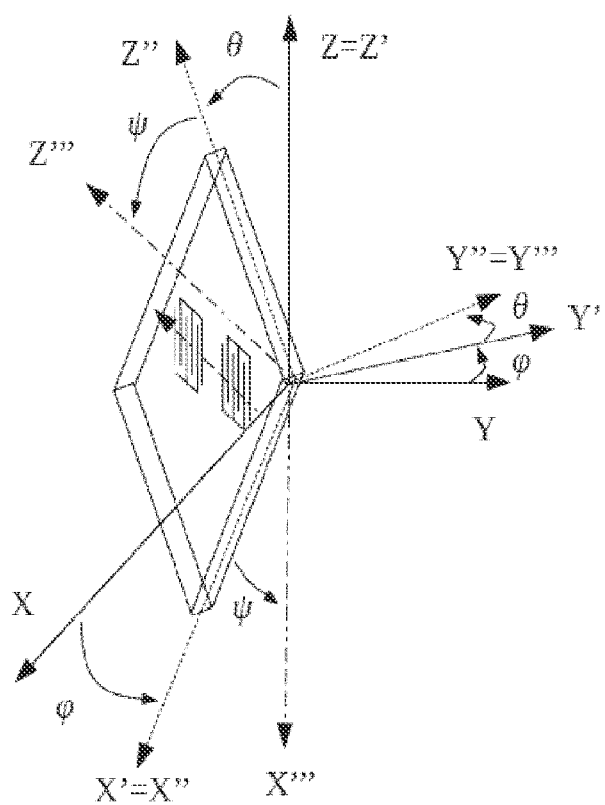
FIG. 11 represents a sketch illustrating coordinates and angles of a triple-rotated crystal cut.

Assuming now that none of the angles is zero, the general case of a triple-rotation or triply-rotated cut is considered. In that situation, the quartz crystal has a cutting plane (X", Z") defined with respect to the cutting plane (X, Z) and in a reference system (X", Y", Z"), where X, Y, Z are crystallographic axes of quartz, a direction of propagation of the waves being defined along an axis X''', a first cutting plane (X', Z') being defined by rotation by an angle Y about the axis Z of the plane (X, Z) so as to define a first reference system (X', Y', Z') with an axis Z' that is the same as the axis Z, a second cutting plane (X", Z") being defined by rotation by an angle θ about the axis X' of the plane (X', Z') so as to define a second reference system (X", Y", Z") with the axis X" being the same as the axis X', the direction of propagation along the axis X' being defined by rotation by an angle ψ of the axis X", in the plane (X", Z") about the axis Y", as shown in FIG. 11.

Some symmetry rules are recalled hereafter for quartz. Quartz is a trigonal crystal of class 32. Therefore, it is characterized by a ternary axis, i.e., the Z axis around which one can establish the relation:

(YXw)/φ=(YXw)/φ+120°

The two other axes are binary and therefore the following symmetry relations hold:

(YXT)/θ=(YXT)/θ+180°, (YXt)/ψ=(YXt)/ψ+180°

For simple geometrical reasons, it is easy to demonstrate that the following set of axes are equivalent:

(YXwlt)/+φ/+θ/+ψ=(YXwlt)/-φ/+θ/-ψ

Actually, assuming that the upper face is identified by the plus sign for Y (the face where the surface wave is assumed to propagate), the bottom face of the plate is obtained by changing the sign to minus. Considering that the symmetry operation does not change the sign of ψ one would assume that the direction of Z''' on the bottom side is unchanged but actually it is rotated by 180°. Therefore, to recover the top surface situation, it is mandatory to apply a 180° rotation on y, which actually is equivalent to a sign change. Note that for crystal cuts without rotation around Z (φ=0°), the following symmetry is effective: (YXlt)/+θ/+ψ=(YXlt)/+θ/-ψ.

The invention claimed is:

1. An acoustic wave sensor device, comprising:
   a quartz material layer comprising a planar surface;
   arranged along a first axis, a first interdigitated transducer disposed over the planar surface of the quartz material layer, a first reflection structure disposed over the planar surface of the quartz material layer, and a second reflection structure disposed over the planar surface of the quartz material layer; and
   arranged along a second axis, a second interdigitated transducer disposed over the planar surface of the quartz material layer, a third reflection structure disposed over the planar surface of the quartz material layer, and a fourth reflection structure disposed over the planar surface of the quartz material layer;
   and wherein:
   the first axis and the second axis are inclined to each other by a finite angle; and
   the planar surface of the quartz material layer is defined by a crystal cut of a quartz material of the quartz material layer with angles φ in the range of −14° to −24°, θ in the range of −25° to −45° and ψ in the range of +8° to +28°.

2. The acoustic wave sensor device of claim 1, wherein the quartz material layer is a bulk substrate.

3. The acoustic wave sensor device of claim 2, further comprising a bulk substrate, and wherein the quartz material layer is disposed over the bulk substrate.

4. The acoustic wave sensor device of claim 3, wherein the bulk substrate comprises a silicon or sapphire bulk substrate.

5. The acoustic wave sensor device of claim 1, wherein at least one of the first, second, third and fourth reflection structures comprises or consists of a Bragg mirror.

6. The acoustic wave sensor device of claim 5, wherein the first reflection structure consists of a first Bragg mirror, the second reflection structure consists of a second Bragg mirror, the third reflection structure consists of a third Bragg mirror and the fourth reflection structure consists of a fourth Bragg mirror, and wherein all of the first, second, third and fourth Bragg mirrors have the same number and/or lengths of electrodes.

7. The acoustic wave sensor device of claim 5, wherein the first reflection structure consists of a first Bragg mirror, the second reflection structure consists of a second Bragg mirror, the third reflection structure consists of a third Bragg mirror and the fourth reflection structure consists of a fourth Bragg mirror and electrodes of each of the first, second, third and fourth Bragg mirrors are, respectively,
   a) connected to each other; or
   b) grounded; or
   c) neither connected to each other nor grounded.

8. The acoustic wave sensor device of claim 1, wherein the first and second reflection structures are located adjacent to the first interdigitated transducer and the third and fourth reflections structures are located adjacent to the second interdigitated transducer.

9. The acoustic wave sensor device of claim 1, wherein:
   a first resonance cavity is disposed between the first interdigitated transducer and the first reflection structure and a second resonance cavity is disposed between the first interdigitated transducer and the second reflection structure; and
   a third resonance cavity is disposed between the second interdigitated transducer and the third reflection structure and a fourth resonance cavity is disposed between the second interdigitated transducer and the fourth reflection structure.

10. The acoustic wave sensor device of claim 9, wherein:

an upper surface of the second resonance cavity comprises a physical and/or chemical modification as compared to an upper surface of the first resonance cavity; and/or an upper surface of the fourth resonance cavity comprises a physical and/or chemical modification as compared to an upper surface of the third resonance cavity.

11. The acoustic wave sensor device of claim 10, wherein the physical and/or chemical modification comprises a metallization layer or passivation layer disposed on the upper surface of the second resonance cavity and/or fourth resonance cavity.

12. The acoustic wave sensor device of claim 9, wherein extension lengths of the first resonance cavity and the second resonance cavity differ from each other.

13. The acoustic wave sensor device of claim 1, wherein the first and second interdigitated transducers are connected in series or in parallel to each other.

14. The acoustic wave sensor device of claim 1, wherein the acoustic wave sensor device is a passive surface acoustic wave sensor device configured for sensing an ambient parameter selected from one of a temperature, chemical species, strain, pressure, torque of a rotating axis, and acceleration or frequency vibration of a vibrating part.

15. The acoustic wave sensor device of claim 1, wherein q is in the range of $-17°$ to $-22°$, $\theta$ is in the range of $-30°$ to $-40°$ and $\psi$ is in the range of $+10°$ to $+25°$.

16. The acoustic wave sensor device of claim 15, wherein q is in the range of $-19°$ to $-21°$, $\theta$ is in the range of $-33°$ to $-39°$ and $\psi$ is in the range of $+15°$ to $+25°$.

17. The acoustic wave sensor device of claim 1, wherein the first and second interdigitated transducers have a same number of electrodes and/or a same metallization ratio and/or a same aperture and/or a same tapering and/or lengths of electrodes.

* * * * *